(12) United States Patent
Marieb et al.

(10) Patent No.: US 7,220,674 B2
(45) Date of Patent: *May 22, 2007

(54) COPPER ALLOYS FOR INTERCONNECTIONS HAVING IMPROVED ELECTROMIGRATION CHARACTERISTICS AND METHODS OF MAKING SAME

(75) Inventors: Thomas N. Marieb, Portland, OR (US); Paul McGregor, Hillsboro, OR (US); Carolyn Block, Portland, OR (US); Shu Jin, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/859,327

(22) Filed: Jun. 1, 2004

(65) Prior Publication Data

US 2004/0219788 A1 Nov. 4, 2004

Related U.S. Application Data

(62) Division of application No. 09/739,929, filed on Dec. 18, 2000, now Pat. No. 6,800,554.

(51) Int. Cl.
*H01L 21/44* (2006.01)
(52) U.S. Cl. ............... 438/687; 438/542; 257/E21.467
(58) Field of Classification Search ........ 438/658–660, 438/678, 687, 691, 542, 558, 561, 902
See application file for complete search history.

(56) References Cited

U.S. PATENT DOCUMENTS 6,022,808 A 2/2000 Nogami et al.

(Continued)

FOREIGN PATENT DOCUMENTS

EP 0 878 834 A2 11/1998

(Continued)

OTHER PUBLICATIONS

Corrosion and Electromigration-Resistant High-Conductivity VLSI Interconnects, IBM Technical Disclosure Bulletin, IBM Corp., New York, U.S.A., vol. 36, No. 4, Apr. 1, 1993, pp. 335-336.

(Continued)

*Primary Examiner*—Quoc Hoang
(74) *Attorney, Agent, or Firm*—Blakely, Sokoloff, Taylor & Zafman LLP

(57) ABSTRACT

Formation of copper alloy interconnect lines on integrated circuits includes introducing dopant elements into a copper layer. Copper alloy interconnect lines may be formed by providing a doping layer over a copper layer, driving dopant material into the copper layer with a high temperature step, and polishing the copper layer to form individual lines. Copper alloy interconnect lines may be formed by implanting dopants into individual lines. Copper alloy interconnect lines may be formed by providing a doped seed layer with a capping layer to prevent premature oxidation, forming an overlying copper layer, driving in the dopants, and polishing to form individual lines. In this way, electromigration resistance and adhesion characteristics may be improved by having relatively higher doping concentrations at outer portions of an interconnect line while the desired low electrical resistivity of the interconnect is maintained by keeping the interior portions of the interconnect with a substantially lower doping concentration.

13 Claims, 6 Drawing Sheets

---

FORM A COPPER LAYER OVERLYING A PATTERNED DIELECTRIC LAYER
302

↓

FORM A DOPED LAYER SUPERJACENT THE COPPER LAYER
304

↓

THERMALLY DRIVE DOPANTS FROM DOPED LAYER INTO COPPER LAYER
306

U.S. PATENT DOCUMENTS

| | | | |
|---|---|---|---|
| 6,117,770 A * | 9/2000 | Pramanick et al. | 438/659 |
| 6,130,156 A * | 10/2000 | Havemann et al. | 438/637 |
| 6,136,707 A | 10/2000 | Cohen | |
| 6,160,315 A | 12/2000 | Chiang et al. | |
| 6,268,291 B1 * | 7/2001 | Andricacos et al. | 438/694 |
| 6,426,289 B1 * | 7/2002 | Farrar | 438/670 |
| 6,440,849 B1 * | 8/2002 | Merchant et al. | 438/658 |
| 6,479,389 B1 | 11/2002 | Tsai et al. | |
| 6,518,668 B2 | 2/2003 | Cohen | |
| 6,607,640 B2 * | 8/2003 | Sundarrajan et al. | 204/192.15 |
| 6,610,151 B1 | 8/2003 | Cohen | |
| 6,689,689 B1 * | 2/2004 | Besser et al. | 438/687 |
| 6,800,554 B2 * | 10/2004 | Marieb et al. | 438/687 |
| 2003/0129828 A1 | 7/2003 | Cohen | |
| 2004/0087171 A1 | 5/2004 | Cohen | |
| 2004/0224507 A1 * | 11/2004 | Marieb et al. | 438/687 |

FOREIGN PATENT DOCUMENTS

JP          2000150522          5/2000

OTHER PUBLICATIONS

Cu(Sn) Alloys for Chip and Package Interconnects, IBM Technical Disclosure Bulletin, IBM Corp., New York, U.S.A., vol. 37, No. 10, Oct. 1, 1994, p. 61.

Search Report for PCT/US 01/43915 mailed Aug. 5, 2002, 5 pages.

\* cited by examiner

COPPER ALLOYS FOR INTERCONNECTIONS HAVING IMPROVED ELECTROMIGRATION CHARACTERISTICS AND METHODS OF MAKING SAME

The present patent application is a divisional of application Ser. No. 09/739,929 filed Dec. 18, 2000, now U.S. Pat. No. 6,800,554.

BACKGROUND OF THE INVENTION

1. Field of the Invention

The present invention relates generally to the field of integrated circuit manufacturing, and more specifically, to copper alloy interconnections and their formation.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology have led to the integration of millions of transistors, each capable of switching at high speed. A consequence of incorporating so many fast switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect. Additionally, because the capacitance between two electrical nodes is a function of the overlap area between those nodes, using a smaller copper interconnect line results in a decrease in parasitic capacitance. In this way, replacing aluminum-based interconnects with copper-based interconnects provides, depending on the dimensions chosen, reduced resistance, reduced capacitance, or both.

As noted above, copper has electrical advantages, such as lower resistance per cross-sectional area, the ability to provide for reduced parasitic capacitance, and greater immunity to electromigration. For all these reasons, manufacturers of integrated circuits find it desirable to include copper in their products.

While copper is electrically advantageous as compared to aluminum for interconnect lines in integrated circuits, pure copper interconnect lines may still suffer from electromigration related defects.

Accordingly, there is a need for providing copper-based interconnections on integrated circuits that have improved levels of electromigration resistance.

DETAILED DESCRIPTION

Figure 1:
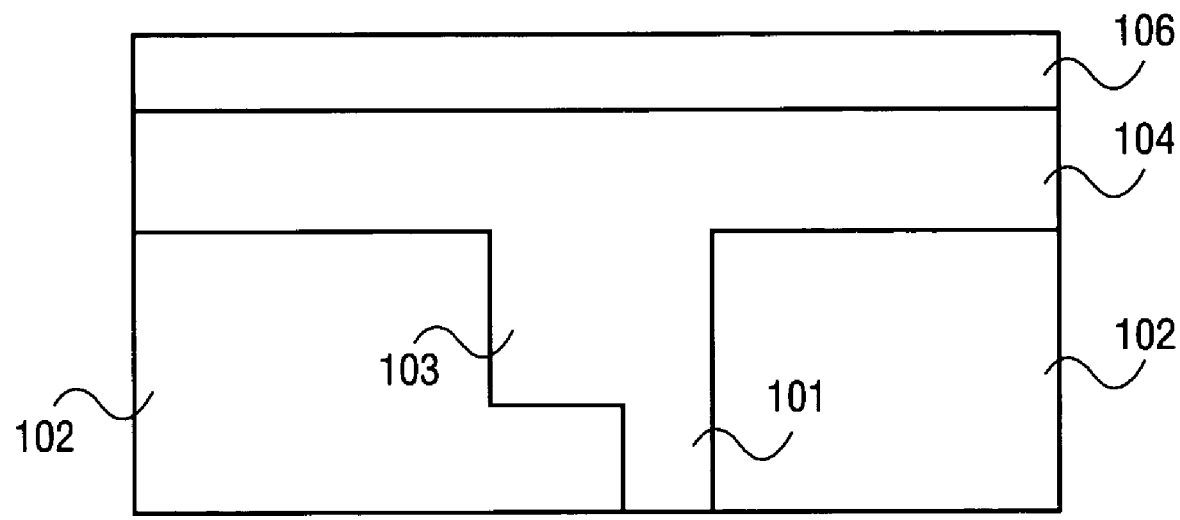
FIG. 1 is a schematic cross-sectional view of a portion of a partially processed wafer showing a copper layer deposited over a patterned ILD which includes a trench, and a dopant layer superjacent the copper layer.

Methods of introducing dopants into copper interconnect structures, and the resulting copper alloy interconnect structures are described. In the following description numerous specific details are set forth to provide an understanding of the present invention. It will be apparent, however, to those skilled in the art and having the benefit of this disclosure, that the present invention may be practiced with apparatus and processes that vary from those specified herein.

Reference herein to "one embodiment", "an embodiment", or similar formulations, means that a particular feature, structure, or characteristic described in connection with the embodiment is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Terminology

The terms, chip, integrated circuit, monolithic device, semiconductor device or component, microelectronic device or component, and similar terms and expressions, are sometimes used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnects or simply metal.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

A substrate may also be referred to as a wafer. Wafers, may be made of semiconducting, non-semiconducting, or combinations of semiconducting and non-semiconducting materials. Silicon wafers may have thin films of various materials formed upon them. Other materials such as GaAs, silicon-on-sapphire, or silicon on insulator (SOI) may be used to form wafers.

The term vertical, as used herein, means substantially perpendicular to the surface of a substrate.

Copper and copper-based interconnect lines for integrated circuits are generally formed by what is commonly referred to as a damascene process. A damascene process may also be referred to as an in-laid metal process. Unlike the subtractive etch processes used to form aluminum and aluminum-based interconnect lines, copper and copper-based interconnect lines are typically produced by first forming a dielectric layer, patterning the dielectric layer to provide recessed portions, referred to as trenches, covering the dielectric layer, including the trenches, with copper or a copper-based metal, and removing that portion of the copper or copper-based metal that is outside of the trenches, typically by chemical mechanical polishing, to thereby form individual interconnect lines. In other words, the metal remaining in the trenches are the individual interconnect lines. Typically, the top surface of the dielectric layer and all the surfaces of the trenches are covered with a barrier layer prior to the deposition of the copper or copper-based metal. The material that makes up the barrier layer is chosen such that the barrier is resistant to the passage of copper atoms therethrough. Copper diffusion barrier layers include, but are not limited to, Ta, TaN, TaSiN, W, WN, WSiN, Ti, TiN, TiSiN, and Co. Copper diffusion barriers may be formed from electrically non-conductive materials as well as from conductive materials, although an electrically conductive copper diffusion barrier is typically used. A barrier layer can be deposited by physical vapor deposition (PVD), chemical vapor deposition (CVD) or atomic layer deposition (ALD). A seed layer is typically formed over the barrier layer to facilitate the deposition of the copper or copper-based metal layer. The seed layer, whether formed of Cu or a Cu alloy, can be deposited by PVD, CVD, or ALD. Cu alloy seed layers can be used with or without barrier layer if the Cu alloy acts as the required diffusion barrier.

If, in addition to trenches, deeper openings in the dielectric layer are also patterned such that vias as well as the interconnect lines can be formed, then the process is commonly referred to as a dual damascene process.

It has been demonstrated that by adding small amounts of a second metallic species to copper interconnect lines, the electromigration lifetime of those Cu interconnects is significantly improved.

Dosed Overlayer

Figure 2:
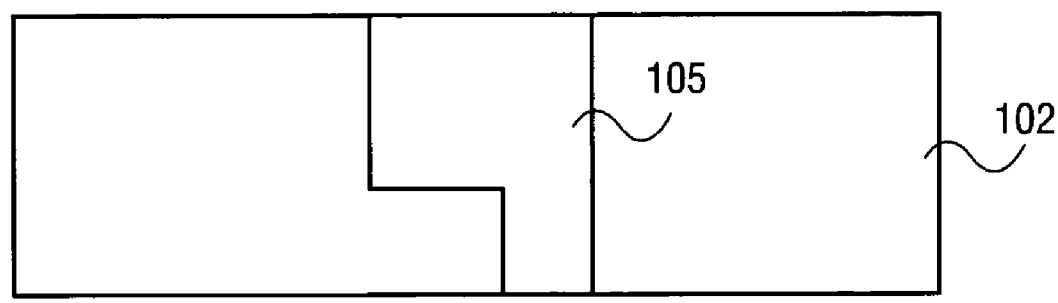
FIG. 2 is a schematic cross-sectional view of the structure of FIG. 1, after a dopants from the dopant layer are thermally driven into the underlying copper layer.

In some embodiments of the present invention, a dopant layer is formed over a copper layer and the dopant is driven into the subjacent copper layer. More particularly, and with reference to FIGS. 1 and 2, a layer of copper 104 is plated over a dielectric layer 102 on a wafer to fill the trenches 103 and via openings 104 of a dual damascene structure. A layer 106 containing at least one alloying element is then deposited over plated copper layer 104, typically to a thickness in the range of 0.5 to 1.0 micron. This alloying element may also be referred to as a dopant, and layer 106 containing the alloying element may be referred to as the dopant layer. Elements that may be used as dopants for improving the electromigration characteristics of the interconnect lines include, but are not limited to, Sn, Al, and Mg.

Portions of the dopant in layer 106 diffuse into copper 104, driven by a high temperature operation. Such a high temperature operation is typically in the range of 300° C. to 400° C. and performed in a reducing atmosphere. The residual portion of dopant layer 106 is then removed, typically by chemical mechanical polishing, leaving a doped copper interconnect line 105 that has improved electromigration characteristics. However, a typical consequence of introducing such a second metallic species throughout the copper interconnect structure is a reduction in conductivity compared to pure Cu. With respect to the illustrative dopants, Sn, Al, and Mg, in each case, the amount of dopant is in the range of 0.1 atomic % to 2 atomic %.

Figure 3:
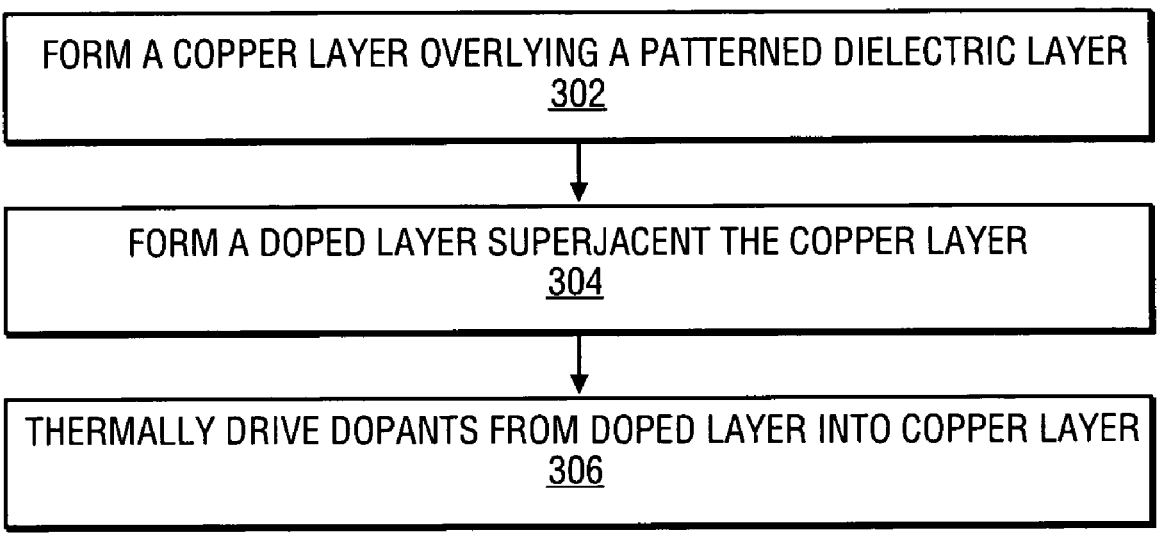
FIG. 3 is a flowchart showing the operations of a process in accordance with the present invention in which a doped overlayer is the source of alloying elements for formation of a Cu alloy.

FIG. 3 summarizes the operations of an illustrative process in accordance with the present invention. A copper layer is formed overlying a patterned dielectric layer (302). Consistent with a damascene metallization process the patterning of the dielectric layer is for the purpose of forming trenches and via openings, and typically the patterned dielectric layer has a copper diffusion barrier disposed thereon over which the copper layer is disposed. A doped layer is subsequently formed superjacent the copper layer (304). The doped layer may be electroplated or formed in any other suitable manner. The doped layer contains at least one element which, when alloyed with copper, improves the electromigration characteristics the copper. By way of example and not limitation, Al, Mg, Sn, and Co are doping species that can improve the electromigration performance of copper. In particular, Sn, and Sn containing metals can be plated onto the copper layer in a known manner. Dopants from the doped layer are thermally driven into the underlying copper layer (306). Such a thermal drive-in is typically conducted in the range of 300° C. to 400° C.

Implanted Dopants

In some embodiments of the present invention, a dopant element is introduced into a local region of the copper interconnect structure by ion implantation. By limiting the doped regions to a near-surface portion of the copper interconnect structure, improved electromigration characteristics can be achieved without reducing the conductivity of the entire interior portion of the copper interconnect structure. Additionally, such surface doping treatments may provide improved adhesion between the interconnect lines and adjacent layers of dielectric material.

In one embodiment, prior to introduction of dopants by ion implantation, a copper damascene structure is formed in a conventional manner. For example, in a dual damascene process, trenches and via openings are formed in an oxide-based interlayer dielectric material. A copper diffusion barrier is formed over the surfaces of the interlayer dielectric including the surfaces of the trenches and via openings. A seed layer is formed over the barrier layer, and copper is then plated over the seed layer. Copper may be plated by an electroplating process or by an electroless deposition process. Excess portions of the copper layer and barrier layer, that is, those portions overlying the top surface of the interlayer dielectric, are removed, typically by chemical mechanical polishing, thereby leaving the individual interconnects. The surface of the wafer after polishing presents a first portion which is the top surface of the interlayer dielectric, and a second portion which is the top surface of the individual interconnect lines.

Figure 4:
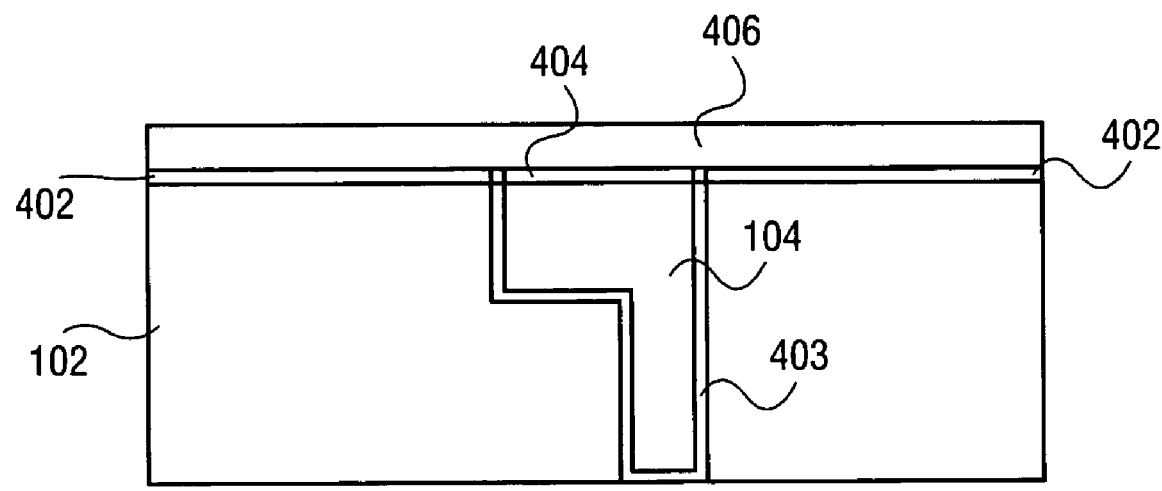
FIG. 4 is a schematic cross-sectional view of a portion of a partially processed wafer showing an individual copper interconnect line disposed within an dielectric layer, an implanted layer superjacent the top surfaces of the dielectric layer and the copper interconnect line, and a silicon nitride disposed over the implanted layer.

Doping elements are then implanted over the surface of the wafer. Such doping elements may include, but are not limited to, Sn, Al, and Mg. Where the elements are implanted into the copper interconnect lines, a copper alloy is formed that improves the electromigration characteristics of the interconnect lines. Where the elements are implanted into the surface of the interlayer dielectric, a non-conductive stable oxide is formed. These post-CMP implants into the copper are very shallow, typically on the order of ten monolayers. Both Al and Mg implants may be performed with a dose of 3E15 atoms/cm$^2$ at an energy of 5 keV. The dose and energy settings for ion implantation in this illustrative embodiment were chosen to provide an implant profile with a peak at 50 angstroms below the Cu surface and an average of 1.5 wt % dopant over 100 angstroms. No special temperature or atmosphere is required for activation of the implanted species. Subsequent to implantation of dopant species, a barrier layer is deposited over the surface of the wafer. The barrier layer may be formed from materials such as, but not limited to, silicon nitride and silicon carbide. The barrier layer is preferably formed from a material that substantially or completely prevents diffusion of copper therethrough and into the surrounding dielectric layers. Such a layer may also function as an etch stop layer for subsequent process operations such as the formation of via openings. FIG. 4 shows the features of a structure formed in this way. More particularly, a dielectric layer 102 that has been patterned to accommodate a trench and a via opening, has a copper-diffusion barrier layer 403 disposed thereon as shown. A copper-based interconnect line 104 is shown bounded by barrier layer 403 and implanted region 404. Implanted region 404 is that portion which provides for improved electromigration performance both in terms of current carrying capacity and lifetime. Regions 402 represent the surface of dielectric layer 102 which have been implanted with the same dopant species as the copper-based interconnect line. These dopants typically form a non-conductive metal oxide when implanted into dielectric layer 102. The implanted regions 402, 404 are covered by a barrier layer 406. Barrier layer may also serve as an etch stop layer for subsequent manufacturing operations.

Implanting Al or Mg into the copper interconnect lines has been found to improve electromigration characteristics by approximately 50% to 100% with only an approximately 5% increase in resistance. In particular, the 50% to 100% improvement refers to an increase in current carrying capability while maintaining the same lifetime from the point of view of reliability. Generally, a 2× increase in current carrying capability results in a 4× increase in lifetime.

Figure 5:
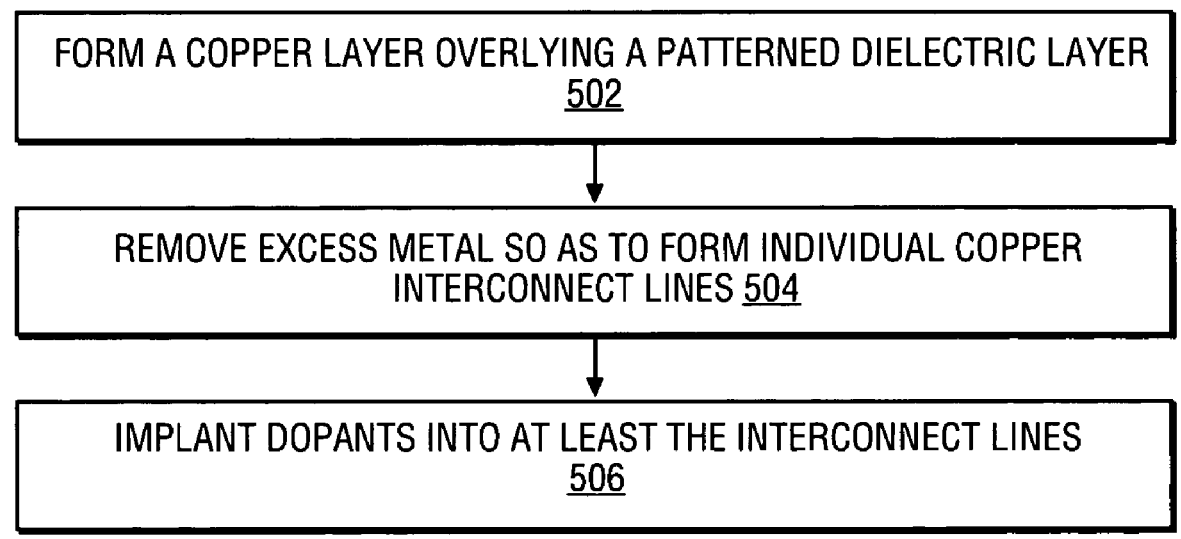
FIG. 5 is a flowchart showing the operations of a process in accordance with the present invention in which dopants are implanted into a localized region of Cu interconnect lines.

FIG. 5 is a flow diagram illustrating the operations in an illustrative embodiment of the present invention in which localized alloy regions are formed by ion implantation. A copper layer is formed overlying a patterned dielectric layer (502). Excess metal is removed so as to form individual copper interconnect lines (504) in accordance with typical damascene metallization processes. Dopants are then implanted into at least the interconnect lines (506). In a presently preferred embodiment, a blanket implant is performed in which both the individual copper interconnect lines and the surrounding dielectric regions are implanted with the dopant species. In this scenario, the implanted species preferably forms an electrically non-conductive compound with the dielectric layer. For example, with an oxide-based dielectric layer and an Al implant, an aluminum oxide is formed in the dielectric regions.

Variations of such an implanted process may include protecting the dielectric regions from implantation by forming a masking layer over the dielectric regions, or forming a barrier/etch stop layer over the post-CMP surface of the substrate and implanting through.

Doped Seed Layer

In some embodiments of the present invention, a dopant element is introduced into a local region of a copper interconnect structure by outdiffusion from a doped seed layer. In such embodiments, a doping element is co-deposited with the Cu seed layer over the copper-diffusion barrier. It is possible in such a process for the doping element or elements co-deposited with the seed layer to oxidize. When the doping element or elements are oxidized, partially or completely, the ability to form the desired copper alloy is reduced or eliminated. In accordance with the present invention, in order to prevent some or all of the dopant in the seed layer from oxidizing, a capping layer is formed over the doped seed layer.

Figure 6:
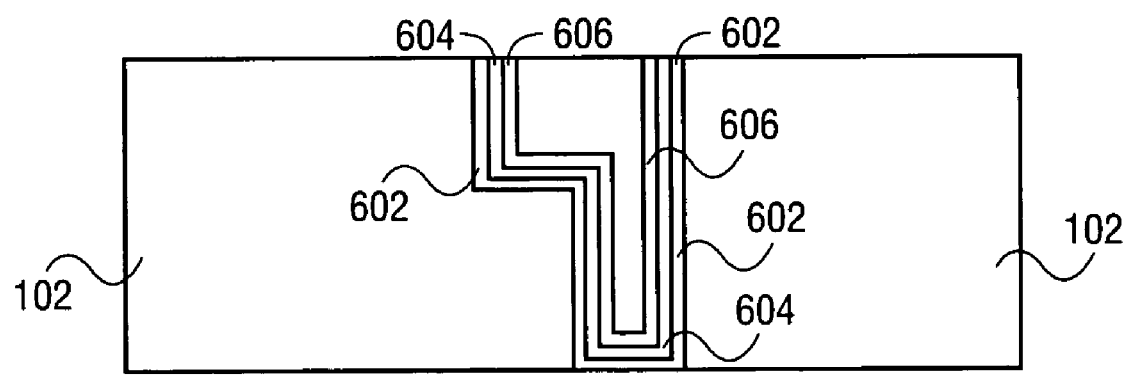
FIG. 6 is a schematic cross-sectional view of a portion of a partially processed wafer showing a capping layer disposed over a doped seed layer.

In one illustrative embodiment, the capping layer is formed by depositing copper over the doped seed layer. More particularly, a seed layer of copper, which is doped with an alloying element, is deposited by magnetron sputtering, and a Cu capping layer is then deposited without breaking vacuum. In this way, the doped seed layer is protected from oxidation by the overlying copper capping layer. In addition to physical vapor deposition, the copper capping layer may be deposited by way of a self-ionizing plasma (SIP). Similarly, if the dopant species is susceptible of an SIP deposition, then the doped seed layer may also be deposited by SIP. FIG. 6 illustrates a barrier/seed/cap stack in accordance with the present invention. A dielectric layer 102 is patterned to form a trench and via opening. A copper-diffusion barrier layer 602 is disposed over the surfaces of dielectric 102. A doped seed layer 604 is disposed over copper-diffusion barrier layer 602. A capping layer 606 comprised of Cu is disposed over doped seed layer 604.

After capping layer 606 is deposited, a Cu layer is formed overlying capping layer 606. This Cu layer is typically formed by electroplating but may also be formed by an electroless deposition. Dopants from the seed layer are then thermally driven into the overlying Cu layer. As noted above, although the dopant will improve the electromigration characteristics of the Cu interconnect lines, it will also undesirably increase the resistivity of the lines. For example, the change in resistivity is approximately 0.6 micro ohm-cm/atomic % Mg added to Cu; approximately 1 micro-ohm-cm/atomic % Al added to Cu; approximately 3 micro-ohm-cm/atomic % Sn added to Cu; and approximately 4 micro-ohm-cm/atomic % Si added to Cu.

To obtain the benefits of electromigration improvements without a substantial resistance penalty, it is desirable to concentrate the dopants at an upper portion of the Cu interconnect lines. In order to facilitate the movement of the dopant to the upper surface of the Cu, the concentration gradient from the doped seed layer to the upper portion of the Cu is modified by a chemical reaction, in accordance with the present invention. This chemical reaction is initiated to draw the dopant out of the upper surface of the Cu such that more dopant diffuses to the upper portions of the Cu to take the place of the dopant consumed by the chemical reaction. By way of illustration and not limitation, if the dopant is Sn and oxygen is introduced during the thermally driven dopant diffusion, then Sn reaching the surface of the Cu reacts to form a tin oxide. In this way the equilibrium concentration of Sn at the upper portions of the Cu is modified, thereby resulting in Sn continuing to move towards the upper portion of the Cu. Nitrogen may also be used to react with a dopant species to form, for example, a nitride.

Figure 7:
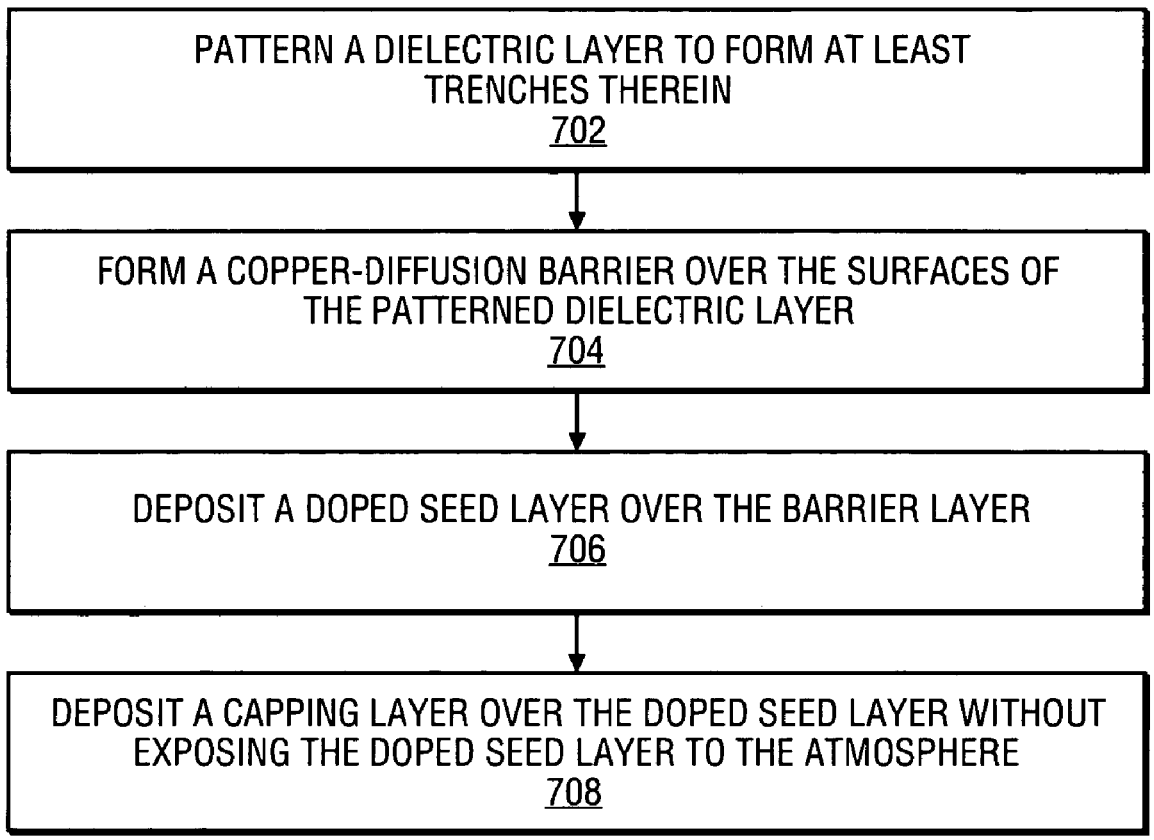
FIG. 7 is a flowchart showing the operations of a process in accordance with the present invention in which a capping layer reduces or prevents the oxidation of elements in a doped seed layer which is the source of alloying elements for the formation of a Cu alloy.

FIG. 7 is a flow diagram illustrating an embodiment of the invention in which a doped seed layer having a capping layer is formed. First, a dielectric layer is patterned to form at least trenches therein (702). Of course, via openings may also be formed as is common in a dual damascene process. Formation of trenches and via openings is well known in this field and therefore the details of such formation are not further described in detail herein. A copper-diffusion barrier layer is formed over the surfaces of the patterned dielectric layer (704). The barrier layer may be formed of any suitable material that substantially reduces or prevents the diffusion of copper atoms into the dielectric layer. A doped seed layer is then deposited over the barrier layer (706). Such doped seed layers include, but are not limited to CuMg and CuSn, and may be deposited by physical vapor deposition or other suitable deposition techniques, such as, but not limited to, a self-ionizing plasma deposition. By way of illustration and not limitation, the CuMg seed layer may contain 0.7 wt % Mg, and the CuSn seed layer may contain 0.5 wt % Sn. Such doped seed layers may have a thickness in the range of 1500 angstroms to 3000 angstroms. Those skilled in the art and having the benefit of this disclosure will recognize that various ranges of dopant concentrations and see layer thicknesses may be used within the scope of the present invention. The doped seed layer may be deposited in an AMAT 5500 Endura platform, available from Applied Materials of Santa Clara, Calif. A capping layer is then deposited without exposing the doped seed layer to the atmosphere (708). The capping layer may be deposited in-situ, that is, is the same chamber in which the doped seed layer is deposited without breaking vacuum. In this way the dopant is not oxidized before the capping layer is in place to prevent the undesired oxidation of the dopants. In this illustrative embodiment, the capping layer is formed by PVD of Cu. It is preferable to perform an in-situ deposition of the capping layer in the same tool without breaking vacuum to prevent oxidation of the underlying dopants. By way of illustration and not limitation, the capping layer formed of Cu may be 1500 angstroms thick.

Figure 8:
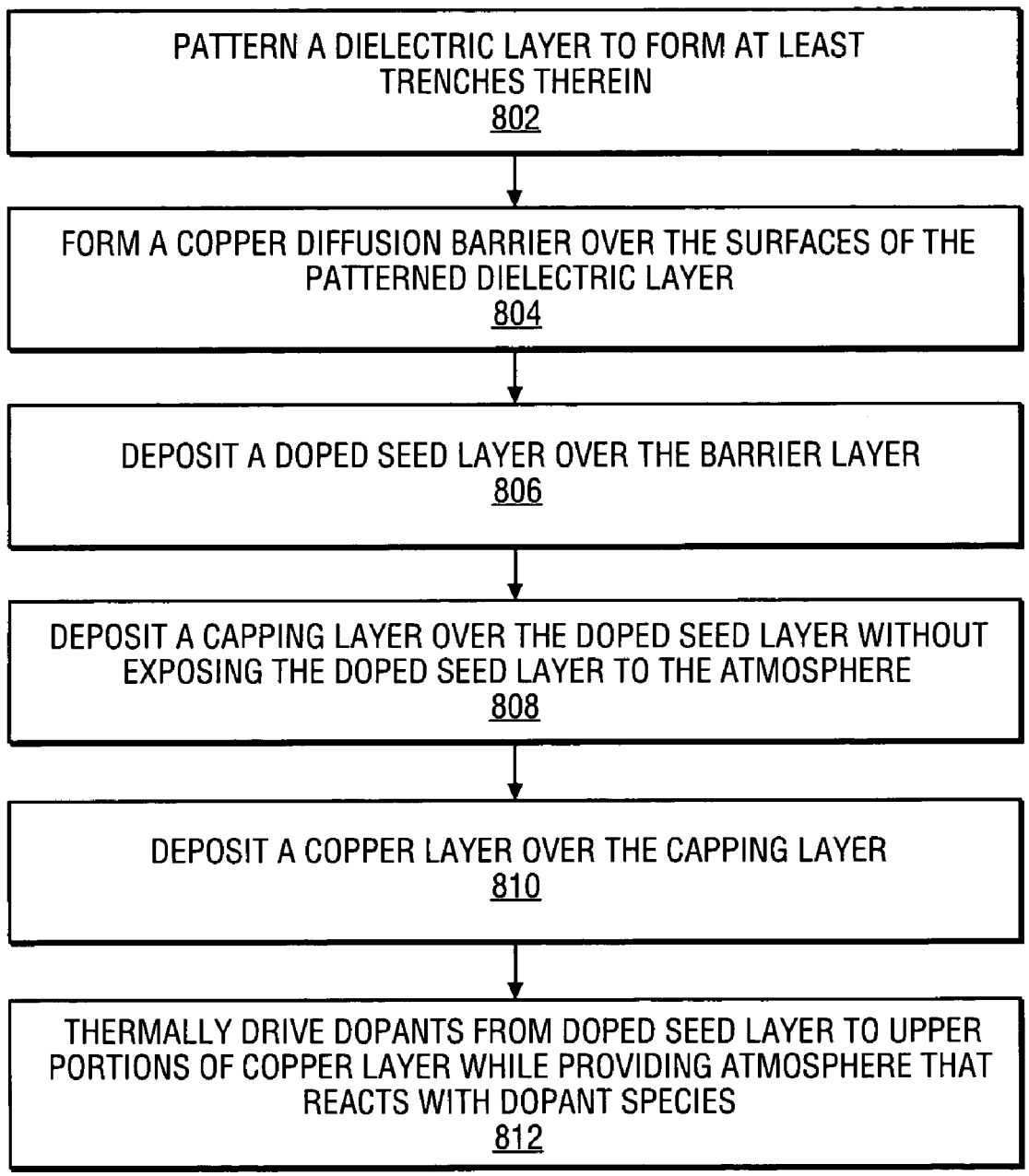
FIG. 8 is a flowchart showing the operations of a process of in accordance with the present invention in which elements from a doped seed layer are drawn to an upper portion of a copper-based interconnect line by a chemical reaction at the surface of the interconnect line.

FIG. 8 is a flow diagram illustrating an embodiment of the invention in which a doped seed layer having a capping layer is formed, and in which a chemical reaction is initiated at the surface of a subsequently deposited layer of Cu in order to alter the distribution of dopants in favor of being distributed towards an upper portion of the Cu layer. First, a dielectric layer is patterned to form at least trenches therein (802). A copper-diffusion barrier layer is formed over the surfaces of the patterned dielectric layer (804). The barrier layer may be formed of any suitable material that substantially reduces or prevents the diffusion of copper atoms into the dielectric layer. A doped seed layer is then deposited over the barrier layer (806). A capping layer is then deposited without exposing the doped seed layer to the atmosphere (808). In this way the dopant is not oxidized before the capping layer is in place to prevent the undesired oxidation of the dopants. In this illustrative embodiment, the capping layer is formed by PVD of Cu. A thick copper layer is then formed (810), typically by electroplating, which covers the capping layer and fills the trenches and via openings, if any. Dopants from the seed layer are then thermally driven from the doped seed layer to upper portions of the Cu layer while the Cu layer is exposed to an atmosphere that reacts with the dopant species (812).

After a copper alloy is formed in which dopants are preferably distributed near the upper portions thereof, excess portions may be removed so as to form individual interconnect lines. Removal of excess portions is typically accomplished by chemical mechanical polishing.

CONCLUSION

Embodiments of the present invention provide copper-based interconnections that include alloy, or doping, elements that improve the electromigration characteristics of such interconnections as compared to pure copper interconnections. Various strategies for introducing the desired doping elements into the copper-based interconnections are described, including thermally driving in dopants from an overlying dopant layer, implanting dopants, and outdiffusing dopants from an underlying doped seed layer.

An advantage of some embodiments of the present invention is that adhesion of various dielectric materials to the copper alloy is improved as compared to pure copper.

An advantage of some embodiments of the present invention is that the electromigration resistance of copper-based interconnects is improved as compared to pure copper.

An advantage of some embodiments of the present invention is that the adhesion between the copper alloys and the barrier layer is improved relative to that of pure copper.

Other modifications from the specifically described apparatus, materials, and processes may be apparent to those skilled in the art and having the benefit of this disclosure. Accordingly, it is intended that all such modifications and alterations be considered as within the spirit and scope of the invention as defined by the subjoined claims.

What is claimed is:

1. A method of forming a Cu alloy, comprising:
   depositing a seed layer on a substrate, the seed layer comprising Cu and at least one first doping element;
   forming a capping layer over the seed layer, wherein the seed layer and the capping layer are formed sequentially and without exposing the seed layer to an atmosphere prior to deposition of the capping layer;
   forming a layer of Cu over the capping layer;
   driving the at least one doping element from the seed layer into the Cu layer; forming a dopant layer having a second doping element over said layer of Cu and driving said second doping element into said layer of Cu.

2. The method of claim 1, wherein the seed layer and the capping layer are formed sequentially and without exposing the seed layer to an atmosphere prior to deposition of the capping layer.

3. The method of claim 1, wherein the seed layer and the capping layer are deposited in the same PVD system without breaking vacuum.

4. The method of claim 1 wherein depositing the seed layer comprises sputtering a metal alloy, the metal alloy having at least one element that diffuses in Cu at temperature less than or equal to 400° C.

5. The method of claim 4, wherein the metal alloy is selected from the group consisting of CuSn and CuMg.

6. The method of claim 4, wherein forming the capping layer comprises sputtering Cu.

7. The method of claim 1, wherein driving the at least one doping element from the seed layer into the Cu layer comprises heating the substrate to temperature in the range of 300° C. to 400° C.

8. The method of claim 7, further comprising exposing at least surface of the Cu layer to an ambient that reacts with the doping element.

9. The method of claim 8, wherein the ambient comprises nitrogen.

10. The method of claim 8, wherein the ambient comprises oxygen.

11. The method of claim 1, wherein the substrate comprises a patterned dielectric layer having a copper diffusion barrier disposed of a surface thereof; depositing the seed layer comprises a physical vapor deposition in the absence of oxygen; forming the capping layer comprises a physical vapor deposition of Cu; forming the Cu layer comprises electroplating; and driving the at least one doping element from the seed layer into the Cu layer comprises heating the substrate and, concurrently therewith, exposing the Cu layer to at least one chemical that will react with the at least one doping element such that the at least one doping element is drawn to an upper portion of the Cu layer.

12. The method of claim 1 wherein said first and said second doping elements are the same.

13. The method of claim 1 wherein said first and said second doping elements are different.

* * * * *